United States Patent
Han et al.

(10) Patent No.: US 11,362,152 B2
(45) Date of Patent: Jun. 14, 2022

(54) ARRAY SUBSTRATE, ELECTROLUMINESCENT PANEL AND DISPLAY DEVICE

(71) Applicant: BOE Technology Group Co., Ltd., Beijing (CN)

(72) Inventors: Ying Han, Beijing (CN); Wei Liu, Beijing (CN); Fengjuan Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 68 days.

(21) Appl. No.: 16/768,174

(22) PCT Filed: Dec. 17, 2019

(86) PCT No.: PCT/CN2019/126102
§ 371 (c)(1),
(2) Date: May 29, 2020

(87) PCT Pub. No.: WO2020/140748
PCT Pub. Date: Jul. 9, 2020

(65) Prior Publication Data
US 2021/0233973 A1 Jul. 29, 2021

(30) Foreign Application Priority Data
Jan. 4, 2019 (CN) .......................... 201910008069.1

(51) Int. Cl.
*H01L 27/32* (2006.01)
*H01L 27/12* (2006.01)

(52) U.S. Cl.
CPC ...... *H01L 27/3227* (2013.01); *H01L 27/1259* (2013.01); *H01L 27/3244* (2013.01); *H01L 27/3269* (2013.01)

(58) Field of Classification Search
CPC .. H01L 27/3227; H01L 27/3244; H01L 27/32
See application file for complete search history.

(56) References Cited

U.S. PATENT DOCUMENTS

| | | | | |
|---|---|---|---|---|
| 2011/0109532 A1* | 5/2011 | Choi | ................... | H01L 27/1259 345/76 |
| 2011/0221720 A1* | 9/2011 | Kuo | ................... | H01L 27/3269 345/206 |

(Continued)

FOREIGN PATENT DOCUMENTS

| | | |
|---|---|---|
| CN | 103762263 A | 4/2014 |
| CN | 105655380 A | 6/2016 |

(Continued)

OTHER PUBLICATIONS

Chinese Office Action corresponding to 201910008069.1 dated May 21, 2020.

*Primary Examiner* — Amr A Awad
*Assistant Examiner* — Maheen I Javed
(74) *Attorney, Agent, or Firm* — ArentFox Schiff LLP; Michael Fainberg

(57) ABSTRACT

The present disclosure provides an array substrate, an electroluminescent panel and a display device, to solve the problems of more manufacturing processes and complex structures of the large-sized OLED display panel in the related art. The array substrate includes: a substrate, a plurality of light sensors on the substrate, a flat layer on the light sensor, and a connected electrode layer on the flat layer, wherein each of the light sensors includes a first electrode, a photosensitive layer and a second electrode arranged in sequence on the substrate; wherein the connected electrode layer is connected with the second electrode through a via hole penetrating through the flat layer.

8 Claims, 3 Drawing Sheets

(56) References Cited

U.S. PATENT DOCUMENTS

| | | | |
|---|---|---|---|
| 2015/0243934 A1* | 8/2015 | Han | G02B 27/10 |
| | | | 438/34 |
| 2015/0277171 A1 | 10/2015 | Hwang et al. | |
| 2020/0013986 A1 | 1/2020 | Li | |
| 2020/0052241 A1 | 2/2020 | Li et al. | |
| 2020/0075570 A1* | 3/2020 | Wang | H01L 27/3227 |
| 2020/0161402 A1 | 5/2020 | Wang et al. | |
| 2020/0251537 A1 | 8/2020 | Wang et al. | |

FOREIGN PATENT DOCUMENTS

| | | |
|---|---|---|
| CN | 108376688 A | 8/2018 |
| CN | 108766989 A | 11/2018 |
| CN | 108767016 A | 11/2018 |
| CN | 108899348 A | 11/2018 |
| CN | 109004015 A | 12/2018 |
| CN | 109728060 A | 5/2019 |

* cited by examiner

ARRAY SUBSTRATE, ELECTROLUMINESCENT PANEL AND DISPLAY DEVICE

CROSS REFERENCE TO RELATED APPLICATIONS

The present disclosure is a National Stage of International Application No. PCT/CN2019/126102, filed on Dec. 17, 2019, which claims the priority of Chinese patent application No. 201910008069.1, filed with Chinese Patent Office on Jan. 4, 2019, both of which are incorporated by reference herein in their entireties.

FIELD

The present disclosure relates to the field of semiconductor technologies, in particular to an array substrate, an electroluminescent panel and a display device.

BACKGROUND

Flat panel displays (FPDs) have become the mainstream products on the market, and more and more types of flat panel displays are available, such as liquid crystal displays (LCDs), organic light emitted diodes (OLEDs), plasma display panels (PDPs) and field emission displays (FEDs).

SUMMARY

An embodiment of the present disclosure provides an array substrate, including a substrate, a plurality of light sensors on the substrate, a flat layer on the light sensor, and a connected electrode layer on the flat layer, wherein each of the light sensors includes a first electrode, a photosensitive layer and a second electrode arranged in sequence on the substrate; wherein the connected electrode layer is communicated with the second electrode through a via hole penetrating through the flat layer.

In one possible implementation, a thin film transistor, corresponding to each of the light sensors, is between the substrate and the light sensor, wherein a source or a drain of the thin film transistor serves as a first electrode.

In one possible implementation, an auxiliary cathode is between the flat layer and the connected electrode layer, and the connected electrode layer is connected with the auxiliary cathode.

In one possible implementation, a spacer is between the auxiliary cathode and the connected electrode layer.

In one possible implementation, an orthographic projection of the spacer on the substrate is smaller than an orthographic projection of the auxiliary cathode on the substrate.

In one possible implementation, an orthographic projection of the spacer on the substrate and an orthographic projection of the photosensitive sensor on the substrate do not overlap with each other.

In one possible implementation, the material of the second electrode layer is indium tin oxide; and the material of the connected electrode layer is indium tin oxide.

An embodiment of the present disclosure further provides an electroluminescent panel, including the array substrate provided in an embodiment of the present disclosure, and further including a light emitting substrate arranged opposite to the array substrate and having a plurality of light emitting elements, wherein each of the light emitting elements includes an anode layer, a light emitting layer and a cathode layer, and the cathode layer is in contact with the connected electrode layer.

In one possible implementation, the light emitting elements are arranged to be in one-to-one correspondence with the light sensors.

An embodiment of the present disclosure further provides a display device, including the electroluminescent panel provided in the embodiment of the present disclosure.

DETAILED DESCRIPTION OF THE EMBODIMENTS

In a large-sized OLED display, in order to perform light compensation on each pixel unit, a light sensor is arranged at the position corresponding to each pixel unit. To reduce the IR drop of a cathode, an auxiliary cathode usually needs to be manufactured, and the auxiliary cathode also needs to be connected with the cathode through a connected electrode layer, i.e., there are the problems of more manufacturing processes and complex structures for the large-sized OLED display panel in the related.

In order to make the objectives, technical solutions, and advantages of the present disclosure clearer, a clear and complete description will be given below on the technical solutions of the embodiments of the present disclosure in combination with accompanying drawings of the embodiments of the present disclosure. Apparently, the described embodiments are only a part but not all of the embodiments of the present disclosure. Based upon the described embodiments of the present disclosure, all of the other embodiments obtained by those skilled in the art without any creative effort shall all fall within the protection scope of the present disclosure.

Unless otherwise defined, the technical or scientific terms used in the present disclosure shall have a general meaning understood by those skilled in the art to which the present disclosure belongs. The terms "first", "second" and the like used in the present disclosure do not indicate any order, quantity, or importance, but are merely intended to distinguish different components. Words like "include" or "including" mean that the element or object preceding the word covers the element or object listed after the word and its equivalent, without excluding other elements or objects. Words like "connection" or "connected" are not limited to physical or mechanical connections, but can include electrical connections, whether direct or indirect. Terms like "upper", "lower", "left", and "right" are merely intended to represent the relative position relationship, and when the absolute position of the described object changes, the relative positional relationship may also change correspondingly.

In order to keep the following description of the embodiments of the present disclosure clear and concise, the detailed description of known functions and known components is omitted in the present disclosure.

Figure 1:
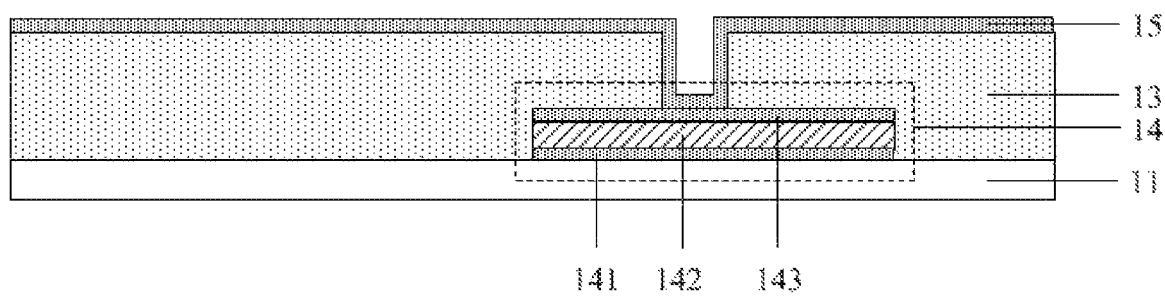
FIG. 1 is a structural schematic diagram of an array substrate provided in an embodiment of the present disclosure.

Please refer to FIG. 1, the embodiment of the present disclosure provides an array substrate, including a substrate 11, a plurality of light sensors 14 on the substrate 11, a flat layer 13 on the light sensors 14, and a connected electrode layer 15 on the flat layer 13, wherein each of the light sensors 14 includes a first electrode 141, a photosensitive layer 142 and a second electrode 143 arranged in sequence on the substrate 11; wherein the connected electrode layer 15 is connected with the second electrode 143 through a via hole penetrating through the flat layer 13. The photosensitive layer 142 can be specifically a PIN structure.

An array substrate provided in the embodiment of the present disclosure includes: a plurality of light sensors 14 on the substrate 11, a flat layer 13 on the light sensor 14, and a connected electrode layer 15 on the flat layer 13, wherein each of the light sensors 14 includes a first electrode 141, a photosensitive layer 142 and a second electrode 143 arranged in sequence on the substrate 11; wherein the connected electrode layer 15 is connected with the second electrode 143 through a via hole penetrating through the flat layer 13, such that the second electrodes 143 of the light sensors 14 share a connected electrode layer 15 which connects the auxiliary cathode and the cathode, thereby keeping the light sensor 14 from separately setting other electrode layers which provide electric signals to the light sensor 14, and further reducing manufacturing processes of large-sized OLED display and simplifying the structure of the large-sized OLED display when the array substrate is applied to the large-sized OLED display.

Figure 2:
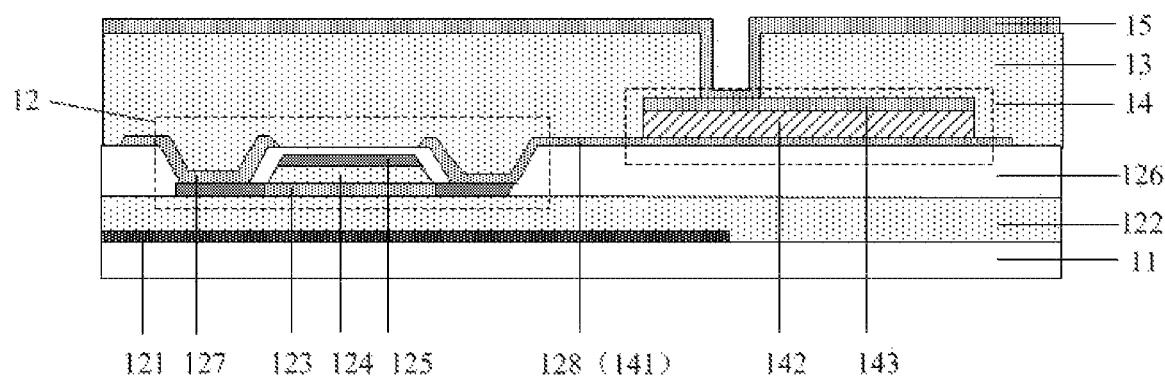
FIG. 2 is a structural schematic diagram of an array substrate with a thin film transistor provided in the embodiment of the present disclosure.

In the specific implementation, as shown in FIG. 2, a thin film transistor 12, corresponding to each of the light sensors 14, is between the substrate 11 and the light sensor 14, wherein a source 127 or a drain 128 of the thin film transistor 12 serves as a first electrode 141. In the embodiment of the present disclosure, the source 127 or the drain 128 of the thin film transistor 12 serves as a first electrode 141 of the photosensitive sensor 14, thereby further reducing manufacturing processes of large-sized OLED display and simplifying the structure of the OLED display. The thin film transistor 12 can be specifically a metal oxide thin film transistor, and can specifically include in sequence: a metal oxide semiconductor active layer 123 on the substrate 11, a gate insulating layer 124 on the metal oxide semiconductor active layer 123, a gate 125 on the gate insulating layer 124, and an interlayer dielectric layer 126 on the gate 125, wherein a buffer layer 122 can further be between the metal oxide semiconductor active layer 123 and the substrate 11, a light-shielding layer 121 can be between the buffer layer 122 and the substrate 11, and an orthographic projection of the light-shielding layer 121 on the substrate 11 can cover an orthographic projection of the metal oxide semiconductor active layer 123 on the substrate 11. Specifically, the substrate 11 can be a glass substrate.

Figure 3:
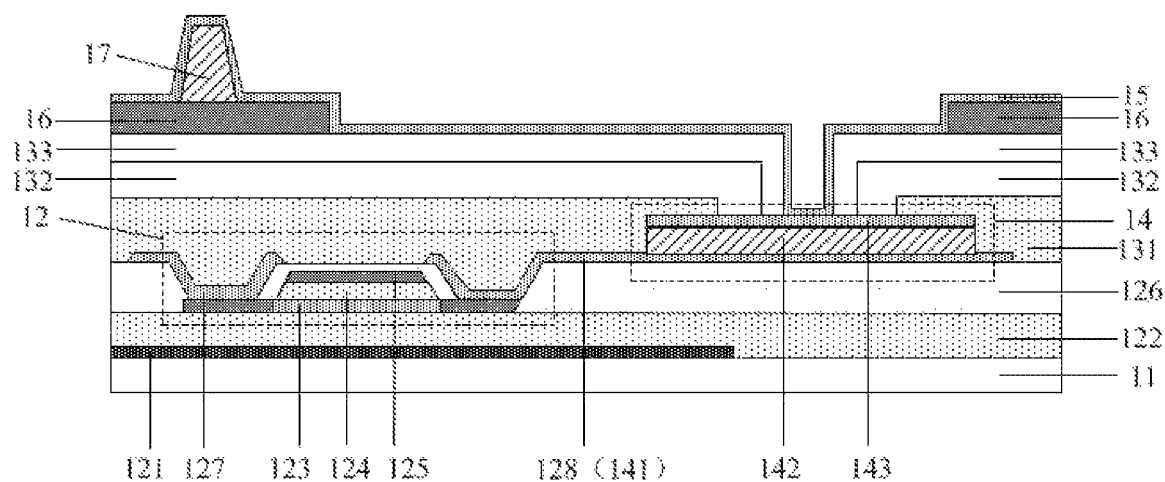
FIG. 3 is a structural schematic diagram of an array substrate with an auxiliary cathode and a spacer provided in the embodiment of the present disclosure.

In the specific implementation, as shown in FIG. 3, an auxiliary cathode 16 is between the flat layer 13 and the connected electrode layer 15, and a spacer 17 is between the auxiliary cathode 16 and the connected electrode layer 15, wherein an orthographic projection of the spacer 17 on the substrate 11 is smaller than an orthographic projection of the auxiliary cathode 16 on the substrate, and the connected electrode layer 15 is connected with the auxiliary cathode 16. The spacer 17 can be in direct contact with the auxiliary cathode 16, and the connected electrode layer 15 can be in direct contact with the spacer 17. Since the projection area of the spacer 17 is smaller than the projection area of the auxiliary cathode 16, in addition to being in direct contact with the spacer 17, the connected electrode layer 15 can also be in direct contact with the auxiliary cathode 16, and further the auxiliary cathode 16 is connected with the connected electrode layer 15. In the condition that the connected electrode layer 15 is connected with the cathode (not shown in FIG. 3), the connection between the auxiliary cathode 16 and the cathode can be finally realized. The material of the auxiliary cathode 16 can be Mo/AlNd/Mo. Specifically, the flat layer 13 can include a first flat layer 132, a second flat layer 133 and a passivation layer 131, wherein the passivation layer 131 is on the source/drain layer of the thin film transistor, the first flat layer 132, which can be specifically a resin layer, is on the passivation layer 131, and is configured to perform preliminary flattening after the thin film transistor is finished; and the second flat layer 133 can be specifically a transparent flat layer, such as over coat (OC), and is configured to perform flattening after the manufacturing of a color resistance film layer (not shown in FIG. 3) is finished.

In the specific implementation, as shown in FIG. 3, an orthographic projection of the spacer 17 on the substrate 11 and an orthographic projection of the photosensitive sensor 14 on the substrate 11 do not overlap with each other. In the embodiment of the present disclosure, the orthographic projection of the spacer 17 on the substrate 11 and the orthographic projection of the photosensitive sensor 14 on the substrate 11 do not overlap with each other, i.e., the spacer 17 and the photosensitive sensor 14 are set in a dislocated manner, and further in the condition that the array substrate is set opposite to the light emitting substrate, the spacer 17 can be kept from blocking the light irradiated onto the photosensitive sensor 14, thereby avoiding that the photosensitive sensor 14 may not normally perform optical detection on the light emitting element of the light emitting substrate.

In the specific implementation, the material of the second electrode layer 143 is indium tin oxide; and the material of the connected electrode layer 15 is indium tin oxide.

Figure 4:
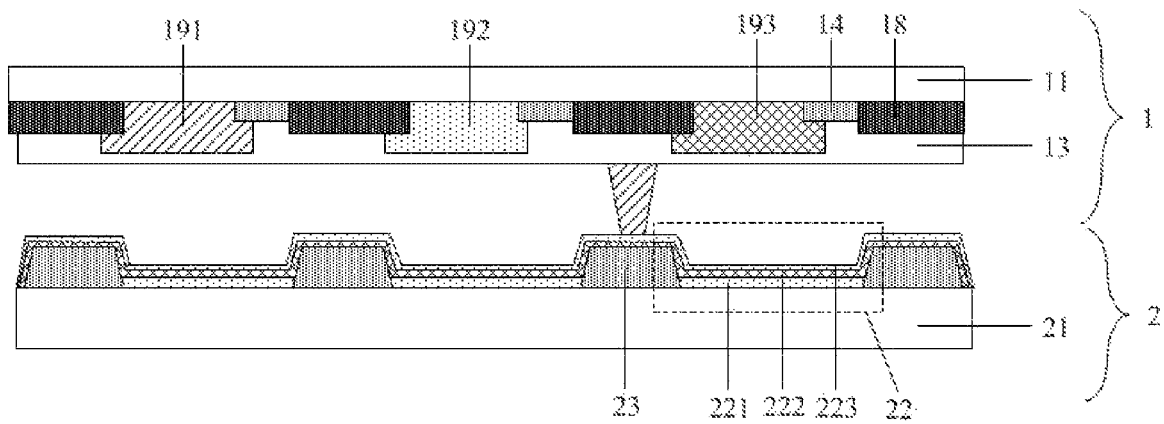
FIG. 4 is a structural schematic diagram of a display device provided in the embodiment of the present disclosure.

As shown in FIG. 4, the embodiment of the present disclosure further provides an electroluminescent panel, including the array substrate 1 provided in the embodiment of the present disclosure, and further including a light emitting substrate 2, which has a plurality of light emitting elements 22, arranged opposite to the array substrate 1, wherein a barrier wall 23 for spacing each light emitting element can also be between adjacent light emitting elements 22, each light emitting element 22 includes an anode layer 221, a light emitting layer 222 and a cathode layer 223, and the cathode layer 223 is in contact with the connected electrode layer. It should be noted that, FIG. 4 is merely a schematic diagram showing part of the structures of the array substrate, and for the specific structure of the array substrate 1, please refer to FIG. 1 to FIG. 3.

The light emitting substrate 2 can specifically include in sequence a drive thin film transistor (not shown in FIG. 4) on the substrate, an anode layer 221 on the drive thin film transistor, a light emitting layer 222 on the anode layer 221, and a cathode layer 223 on the light emitting layer 222. The light emitting layer 222 can specifically emit white light, and the cathode layer 223 can be specifically a whole layer of planar cathodes. The array substrate 1 can specifically serve as an encapsulating cover plate. The array substrate 1 can be specifically set with a color resistance film layer. The color resistance film layer can specifically include a red color resistance element 191, a green color resistance element 192 and a blue color resistance element 193, and a black matrix 18 is between adjacent color resistance elements. Wherein the orthographic projections of the light sensor 14, the black matrix 18 and the color resistance element on the substrate 11 do not completely overlap or do not overlap with each other, to keep the black matrix 18 or the color resistance element from blocking light irradiated onto the light sensor 14.

As shown in FIG. 4, the light emitting elements 22 are in one-to-one correspondence with the light sensors 14. In an embodiment of the present disclosure, the light emitting elements 22 are in one-to-one correspondence with the light sensors 14, thereby detecting whether light emitting of each light emitting element 22 is normal.

Based on the same inventive concept, the embodiment of the present disclosure further provides a display device, including an electroluminescent panel provided in the embodiment of the present disclosure.

Figure 5:
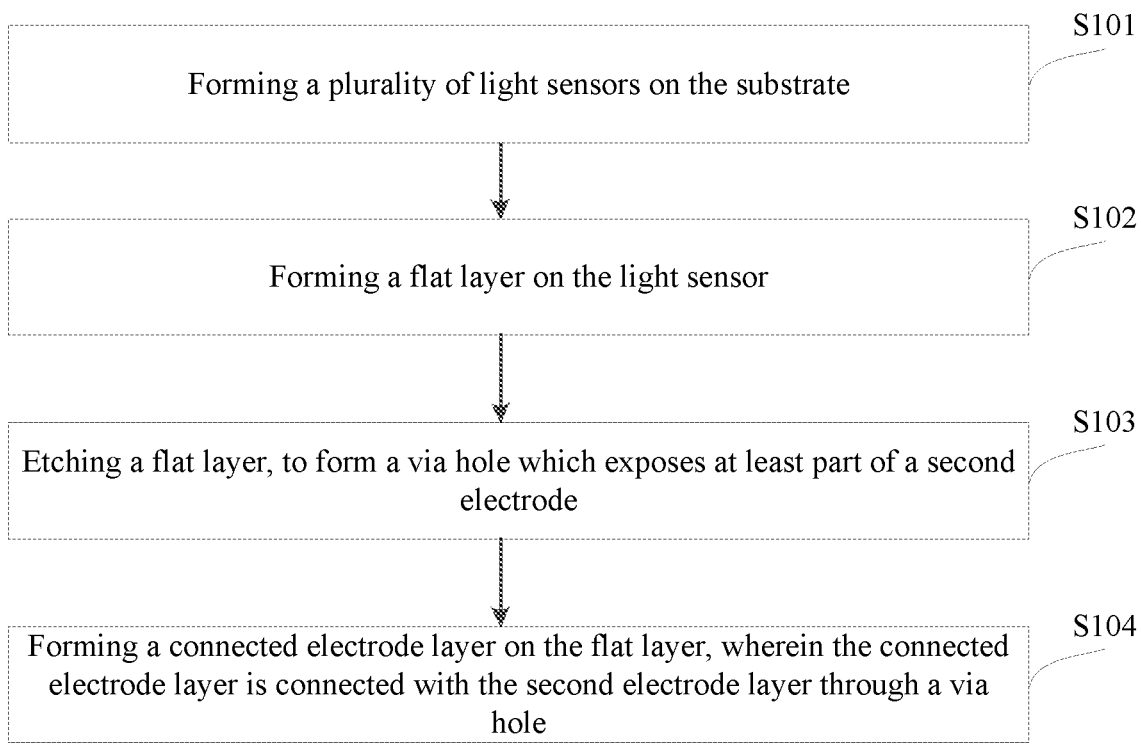
FIG. 5 is a schematic diagram of a manufacturing process of an array substrate provided in the embodiment of the present disclosure.

Based on the same inventive concept, the embodiment of the present disclosure further provides a manufacturing method of the array substrate provided in the embodiment of the present disclosure. As shown in FIG. 5, the manufacturing method includes:

Step S101, forming a plurality of light sensors on the substrate, wherein the light sensor includes a first electrode, a photosensitive layer and a second electrode arranged in sequence on the substrate.

Step S102, forming a flat layer on the light sensor.

Step S103, etching a flat layer, to form a via hole which exposes at least part of a second electrode.

Step S104, forming a connected electrode layer on the flat layer, wherein the connected electrode layer is connected with the second electrode layer through a via hole.

Figure 6:
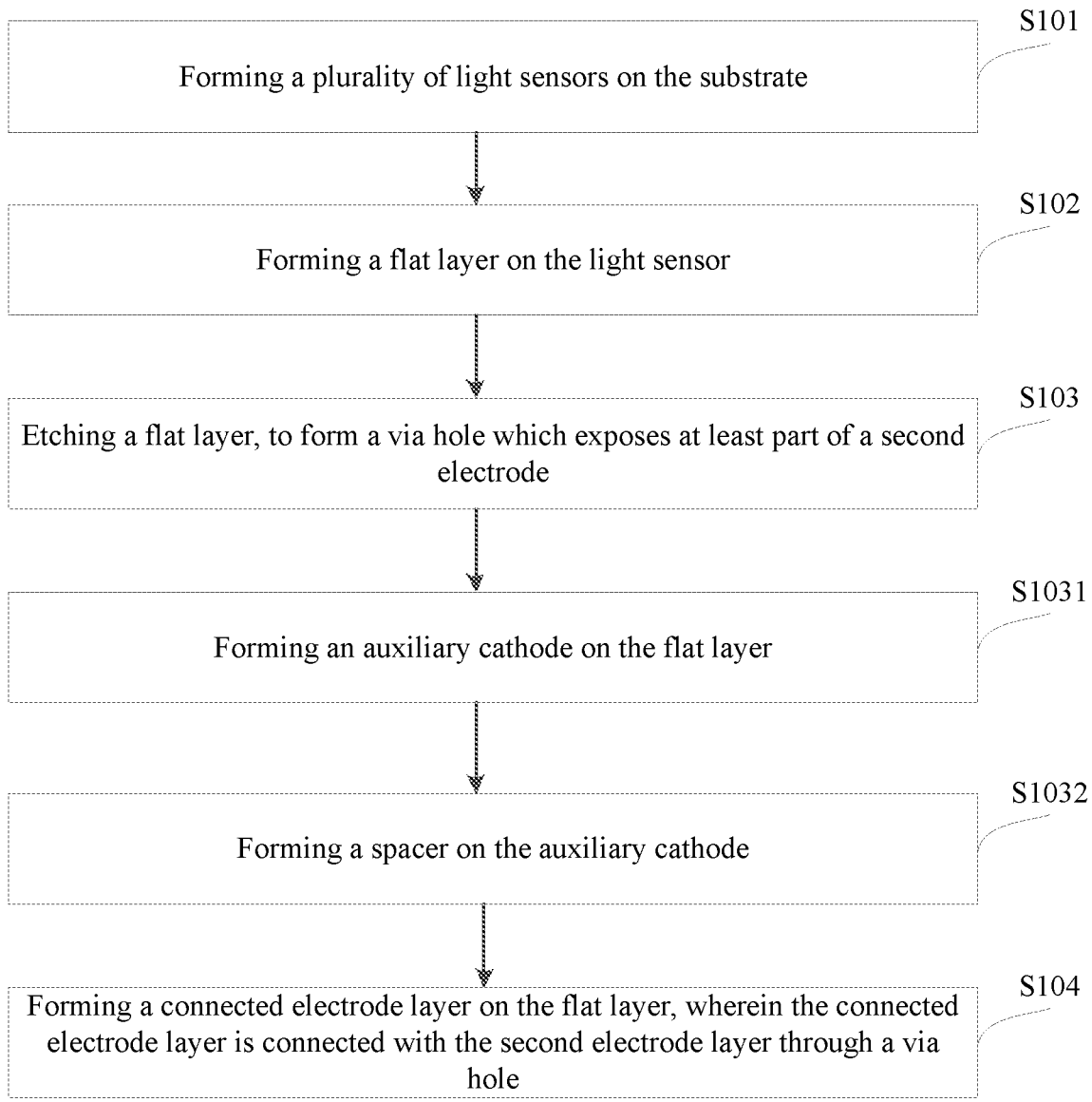
FIG. 6 is a schematic diagram of a specific manufacturing process of a array substrate provided in an embodiment of the present disclosure.

In the possible implementation, as shown in FIG. 6, before the step of forming the connected electrode layer on the flat layer, the manufacturing method further includes the following step.

Step S1031, forming an auxiliary cathode on the flat layer.

Step S1032, forming a spacer on the auxiliary cathode.

The array substrate provided in the embodiment of the present disclosure includes: a plurality of light sensors on the substrate, a flat layer on the light sensor, and a connected electrode layer on the flat layer, wherein each light sensor includes a first electrode, a photosensitive layer and a second electrode arranged in sequence on the substrate; wherein the connected electrode layer is connected with the second electrode through a via hole penetrating through the flat layer, such that the second electrodes of the light sensors share a connected electrode layer which connects the auxiliary cathode and the cathode, thereby keeping the light sensor from separately setting other electrode layers which provide electric signals to the light sensor, and further reducing manufacturing processes of large-sized OLED display and simplifying the structure of the large-sized OLED display when the array substrate is applied to the large-sized OLED display.

Evidently those skilled in the art can make various modifications and variations to the embodiment of the present disclosure without departing from the spirit and scope of the embodiment of the present disclosure. Thus the present disclosure is also intended to encompass these modifications and variations thereto so long as the modifications and variations come into the scope of the claims appended to the present disclosure and their equivalents.

We claim:

1. An array substrate, comprising: a substrate, a plurality of light sensors on the substrate, a flat layer on a side of the light sensor away from the substrate, and a connected electrode layer on a side of the flat layer away from the substrate, wherein
    each of the light sensors includes a first electrode, a photosensitive layer on a side of the first electrode away from the substrate and a second electrode on a side of the photosensitive layer away from the substrate; wherein the connected electrode layer is connected with the second electrode through a via hole penetrating through the flat layer;
    a thin film transistor, corresponding to each of the light sensors, is between the substrate and the light sensor, wherein a source or a drain of the thin film transistor serves as the first electrode;
    an auxiliary cathode is between the flat layer and the connected electrode layer, and the connected electrode layer is connected with the auxiliary cathode.

2. The array substrate of claim 1, wherein a spacer is between the auxiliary cathode and the connected electrode layer.

3. The array substrate of claim 2, wherein an orthographic projection of the spacer on the substrate is smaller than an orthographic projection of the auxiliary cathode on the substrate.

4. The array substrate of claim 2, wherein an orthographic projection of the spacer on the substrate and an orthographic projection of the photosensitive sensor on the substrate do not overlap with each other.

5. The array substrate of claim 1, wherein the material of the second electrode layer is indium tin oxide; and the material of the connected electrode layer is indium tin oxide.

6. An electroluminescent panel, comprising the array substrate of any of claim 1, and further comprising a light emitting substrate arranged opposite to the array substrate and having a plurality of light emitting elements, wherein each of the light emitting elements comprises an anode layer, a light emitting layer and a cathode layer, and the cathode layer is in contact with the connected electrode layer.

7. The electroluminescent panel of claim 6, wherein the light emitting elements are arranged to be in one-to-one correspondence with the light sensors.

8. A display device, comprising the electroluminescent panel of claim 6.

* * * * *